(12) United States Patent
Scheffer et al.

(10) Patent No.: US 6,543,041 B1
(45) Date of Patent: Apr. 1, 2003

(54) METHOD AND APPARATUS FOR REDUCING SIGNAL INTEGRITY AND RELIABILITY PROBLEMS IN ICS THROUGH NETLIST CHANGES DURING PLACEMENT

(75) Inventors: Louis K. Scheffer, Campbell, CA (US); Jeffrey S. Salowe, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/333,792

(22) Filed: Jun. 15, 1999

(51) Int. Cl.[7] .............................................. G06F 17/50

(52) U.S. Cl. ................. 716/10; 716/9; 716/12

(58) Field of Search ....................... 716/1–21

(56) References Cited

U.S. PATENT DOCUMENTS

| | | | | | |
|---|---|---|---|---|---|
| 5,410,490 A | * | 4/1995 | Yastrow | .......................... | 716/5 |
| 5,666,288 A | * | 9/1997 | Jones et al. | ..................... | 716/17 |
| 5,726,903 A | * | 3/1998 | Kerzman et al. | ............... | 716/2 |
| 5,751,593 A | * | 5/1998 | Pullela et al. | ................... | 716/6 |
| 5,880,967 A | * | 3/1999 | Jyu et al. | ......................... | 716/6 |
| 5,883,818 A | * | 3/1999 | Salimi et al. | .................... | 716/2 |
| 5,917,728 A | * | 6/1999 | Ueda | ........................... | 716/18 |
| 5,917,729 A | * | 6/1999 | Naganuma et al. | ........... | 716/10 |
| 5,974,245 A | * | 10/1999 | Li et al. | ......................... | 716/10 |
| 5,987,086 A | * | 11/1999 | Raman et al. | .................. | 716/1 |
| 5,995,732 A | * | 11/1999 | Murai | ........................... | 716/5 |
| 6,086,628 A | * | 7/2000 | Dave et al. | ...................... | 716/7 |
| 6,230,304 B1 | * | 5/2001 | Groeneveld et al. | ........... | 716/7 |
| 6,286,128 B1 | * | 9/2001 | Pileggi et al. | ................. | 716/18 |
| 6,311,147 B1 | * | 10/2001 | Tuan et al. | ..................... | 703/18 |
| 6,321,364 B1 | * | 11/2001 | Hirata | ............................ | 716/5 |
| 6,353,917 B1 | * | 3/2002 | Muddu et al. | .................. | 716/6 |

OTHER PUBLICATIONS

NN9410491 ("Technique for Current Detection in Power Converters", IBM Technical Disclosure Bulletin, vol. 37, No. 10, Oct. 1994, pp. 491–494 (4 pages)).*

NN9407165 ("Electromagnetic Interference Reduction through Time Distribution of Clock Signals", IBM Technical Disclosure Bulletin, vol. 37, No. 7, Jul. 1994, pp. 165–168 (5 pages)).*

NN9105353 ("Modeling Large CMOS Circuits", IBM Technical Disclosure Bulletin, vol. 33, No. 12, May 1991, p. 353 (4 pages)).*

NN9009396 ("Technique for Sizing Input Capacitance in Off–Line Power Converters", IBM Technical Disclosure Bulletin, vol. 33, No. 4, Sep. 1990, pp. 396–400 (7 pages)).*

Yang et al. ("Switch–level timing simulation of bipolar ECL circuits", IEEE Transactions on Computer–Aided Design of Integrated Circuits and Systems, vol. 12, No. 4, Apr. 1993, pp. 516–530).*

(List continued on next page.)

*Primary Examiner*—Matthew Smith
*Assistant Examiner*—Phallaka Kik
(74) *Attorney, Agent, or Firm*—Reed Smith Crosby Heafey LLP; John W. Carpenter

(57) ABSTRACT

Described is a method for forming a physical layout on a chip floor for a circuit design based on a netlist. The method tentatively places each of the gates of the netlist to a physical location on the chip floor. The method then estimates potential signal integrity and reliability problems. If the placed net list is not acceptable for not being able to meet the requirements of the circuit design, the method modifies the netlist and re-places each of the gates in the modified netlist into a physical location on the chip floor. The method then re-estimates the potential signal integrity and reliability problems. The method repeats this process until the estimation to the-placed or re-placed netlist is acceptable for being able to meet the requirements of the circuit design.

30 Claims, 6 Drawing Sheets

OTHER PUBLICATIONS

NN9210409 ("Algorithm to Calculate Data Used by Logic Synthesis of Timing Critical Designs", IBM Technical Disclosure Bulletin, vol. 35, No. 5, Oct. 1992, pp. 409–411 (5 pages)).*

NB83123672 ("Circuit Structure for Measuring Delays of Logic Gates on VLSI Chips", IBM Technical Disclosure Bulletin, vol. 26, No. 7B, Dec. 1983, pp. 3672–3674 (6 pages)).*

NN9201230 ("Method of Generating Net Resistance Constraints From RC Delay", IBM Technical Disclosure Bulletin, vol. 34, No. 8, Jan. 1992, pp. 230–232 (5 pages)).*

NB9309301 ("Allocating Maximum RC Delays to Guarantee Timing by Depth First Search", IBM Technical Disclosure Bulletin, vol. 36, No. 9B, Sep. 1993, pp. 301–304 (9 pages)).*

Venkataraman et al. ("Trade–offs between yield and reliability enhancement [VLSI]", Proceedings of 1996 IEEE International Symposium on Defect and Fault Tolerence in VLSI Systems, Nov. 6, 1996, pp. 68–76).*

Balboni et al. ("Clock skew reduction in ASIC logic design: a methodology for clock tree management", IEEE Transactions on Computer–Aided Design of Integrated Circuits and Systems, vol. 17, No. 4, Apr. 1998, pp. 344–356).*

Tenbroek et al. ("Self–heating effects in SOI MOSFETs and their measurement by small signal conductance techniques", IEEE Transactions on Electron Devices, vol. 43, No. 12, Dec. 1996, pp. 2240–2248).*

Jagau ("SIMCURRENT–an efficient program for the estimation of the current flow of complex CMOS circuits", 1990 IEEE International Conference on Computer–Aided Design, ICCAD–90, Digest of Technical Papers, Nov. 11, 1990, pp. 396–399).*

Roy et al. ("Logic synthesis for reliability: an early start to controlling electromigration and hot–carrier effects", IEEE Transactions on Reliability, vol. 44, No. 2, Jun. 1995, pp. 251–255).*

* cited by examiner

METHOD AND APPARATUS FOR REDUCING SIGNAL INTEGRITY AND RELIABILITY PROBLEMS IN ICS THROUGH NETLIST CHANGES DURING PLACEMENT

FIELD OF THE INVENTION

The present invention relates generally to a digital circuit design, and more specifically to a digital circuit design that uses a placement process and a routing process.

BACKGROUND OF THE INVENTION

Using Hardware Description Language (HDL), a digital circuit can be first designed at an abstract level (i.e. Register Transfer Level—RTL) in terms of its functionality and data flow. The functionality of the design is validated through simulation. A logic synthesis process then converts the RTL description to a gate-level netlist, which is a description of the circuit design in terms of gates and their connections. Using the gate-level netlist, a placement process generates a placed netlist, in which each of these gates is placed in a location on a chip floor. Based on the placed netlist, a routing process generates a physical layout by routing conducting lines to connect these gates. The physical layout for the digital circuit design can be finally fabricated onto a silicon chip.

Frequently, particular gate placement and connection patterns (or configurations) can cause signal integrity and reliability problems. For example, when two long conducting lines are closely arranged in parallel with each other, the parallel configuration can result in signals carried on one line interfering with the signals carried on the other nearby lines, and vice versa. This is the so called "crosstalk" problem. Traditionally, signal integrity and reliability problems are analyzed in the post-routing stage because these problems can be accurately analyzed after routing is complete.

One traditional solution to the problems is to make corrections to the physical layout based on the post-routing analysis. Unfortunately, it is difficult to correct these problems by modifying the physical layout. Most corrections require more chip resources (extra routing or extra gates), and a correction to one problem may cause other problems.

Another traditional solution to the problems is to modify the routing process to generate a new physical layout. However, routing modification at the post-routing stage allows only limited changes and this technique may not be able to find a solution without requiring revision of the placement process. It may take several reiterations of: post-routing analysis, routing modification, and placement modification. Because the traditional solution involves re-routing (including global-re-routing and local-re-routing) and re-placement, it is time consuming and not cost effective.

There is, therefore, a need for a method and apparatus to form a physical layout for a circuit design, with improved time and cost efficiency.

There is another need for a method and apparatus to form a physical layout for a circuit design with improved signal integrity and reliability in the post-routing stage.

There is yet another need for a method and apparatus to form a physical layout for a circuit design, which eliminate or reduce signal integrity and reliability problems in the post-routing stage, thus eliminating or reducing the modifications in the re-placement process or re-routing process.

The present invention provides a method and apparatus to meet these needs.

SUMMARY OF THE INVENTION

To address the shortcomings of the prior art, the present invention provides a novel method to form a physical layout for a circuit design.

In a broad aspect, the present invention provides a method for forming a physical layout on a chip floor based on a netlist for a circuit design. The netlist includes a plurality of gates. The method comprises the steps of: (a) assigning each of the gates to a location on the chip floor; (b) estimating potential signal integrity and reliability problems based on the assigned gate locations on the chip floor; (c) modifying the netlist based: on the estimation of the signal integrity and reliability problems, if the estimation made in step (b) is not acceptable; and (d) re-assigning each of the gates in the modified netlist in a location on the chip floor.

The present invention also provides a corresponding apparatus for performing the steps in the method described above.

BRIEF DESCRIPTION OF THE DRAWING

The aforementioned advantages of the present invention as well as additional advantages thereof will be more clearly understood hereinafter as a result of a detailed description of the embodiments of the invention, taken in conjunction with the following drawings in which.

DETAILED DESCRIPTION OF PREFERRED EMBODIMENTS

To overcome the shortcomings of the available art, the present invention discloses a novel method and apparatus for forming a physical layout for a circuit design.

Figure 1:
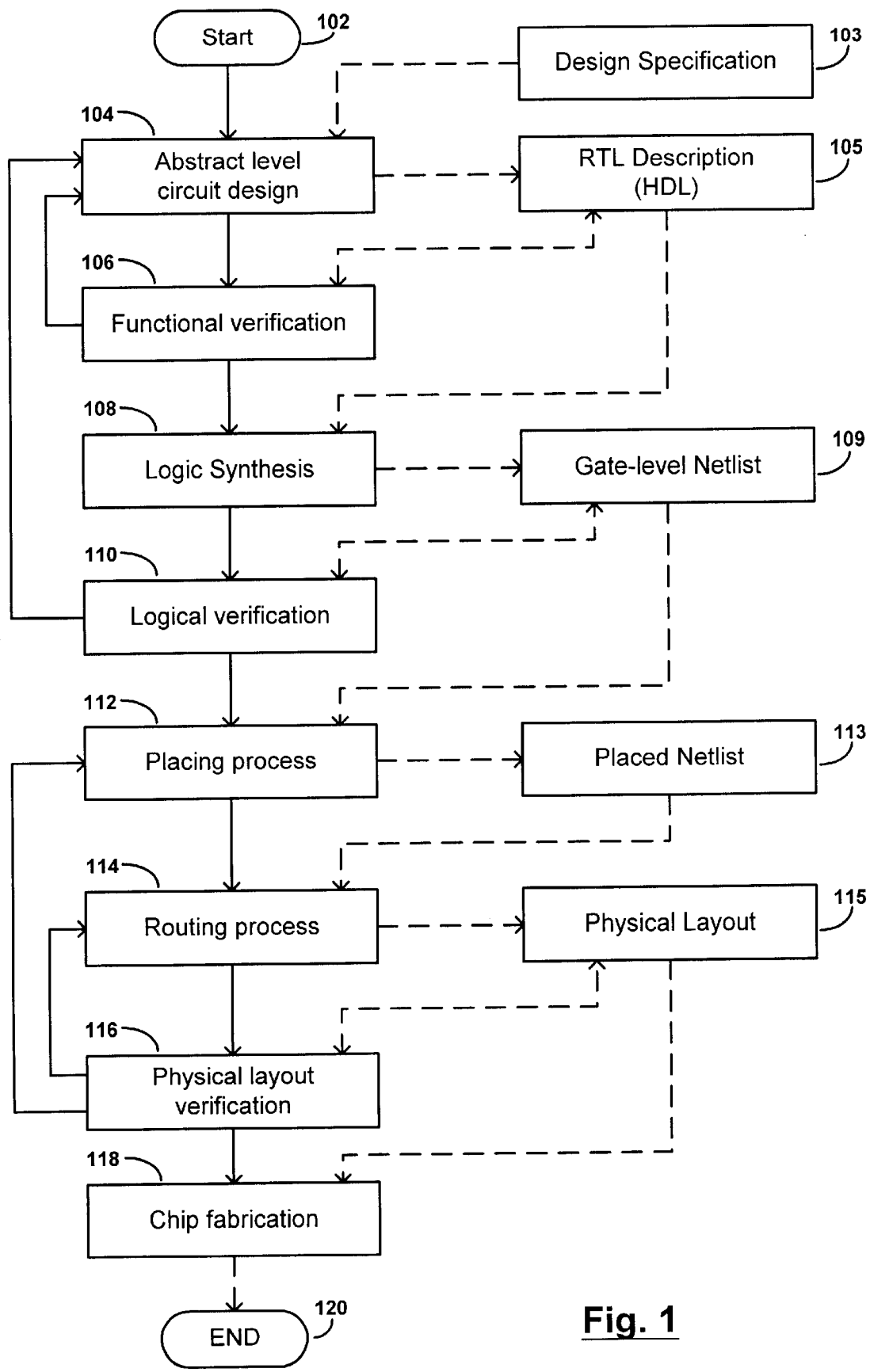
FIG. 1 is a flowchart illustrating a typical circuit design flow.

FIG. 1 shows a flowchart illustrating a typical circuit design flow. In FIG. 1, the blocks in the right side represent inputs and outputs, and the blocks in the left side represent the processes in the circuit design flow.

As shown in FIG. 1, using a design specification 103 for a digital circuit as an input, step 104 describes the circuit design at an abstract level in terms of the circuit's functionality and data flow. More specifically, step 103 transforms the design specification into an RTL description 105.

Using the RTL description 105 as an input, step 106 performs a simulation to verify the functionality of the RTL description. If the simulation results do not comply with the expected results of the circuit design, the operation is led back to step 104 to re-design the circuit at an abstract level. If the simulation results comply with the expected results of the circuit design, the operation is led back to step 108.

Using the verified RTL description 105 as an input, step 108 performs logic synthesis to generate a gate-level netlist 109, which includes the names of the gates, the functions of the gates, and connections among these gates.

Using the gate-level netlist 109 as an input, step 110 performs a simulation to verify the gate-level netlist 109. If the simulation results do not comply with the expected results of the circuit design, the operation is led back to step 104 to re-design the digital circuit at an abstract-level. If the simulation results comply with the expected results of the circuit design, the operation is led to step 112.

Using the verified gate-level netlist 109 as an input, step 112 performs a placing process to generate a placed netlist 113, in which each of the gates in the verified gate-level netlist 109 is assigned in a physical location on a chip floor.

Using the placed netlist 113 as an input, step 114 performs a routing process to generate a physical layout 115, in which the gates in the gate-level netlist are physically connected according to the circuit design on the chip floor.

Using the physical layout 115 as an input, step 116 performs a verification to the physical layout 115 to identify any signal integrity and reliability problems. If there exist any signal integrity and reliability-problems, step 116 modifies the physical layout 115 to correct the problems. If the problems cannot be corrected by modifying the physical layout 115, the operation is led to either step 112 or step 114. If the problems can be corrected or the physical layout 115 passes the verification at step 116, the operation is led to step 118.

Using the verified physical layout 115 as an input, step 118 fabricates the circuit design onto to a silicon chip.

Figure 2:
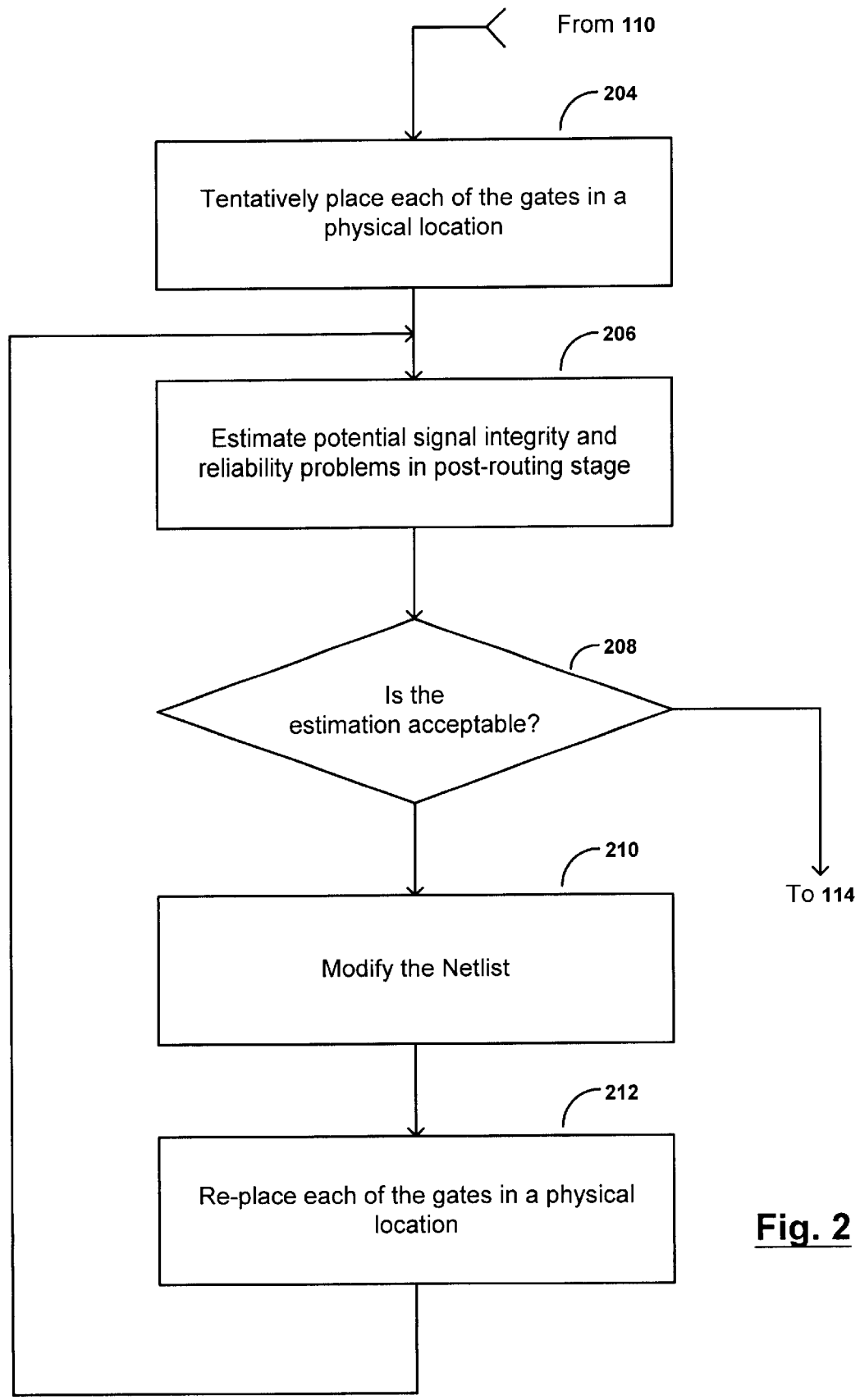
FIG. 2 is a flowchart illustrating the placement process shown in FIG. 1 in greater detail, in accordance with the present invention.

FIG. 2 shows a flowchart illustrating the placing process 1122 shown in FIG. 1 in greater detail, in accordance with the present invention.

As shown in FIG. 2, step 204 tentatively assigns (or places) each of the gates in the gate-level netlist 109 in a physical location on a chip floor.

Step 206 estimates potential signal integrity and reliability problems in post-routing stage if these tentatively assigned physical locations are used in a routing process.

Step 208 determines whether the estimation is acceptable. If step 208 determines the estimation is acceptable, the operation is led to step 114 shown in FIG. 1; if step 208 determines the estimation is not acceptable, the operation is led to step 210.

Step 210 modifies the netlist.

Step 212 re-assigns (or replaces) each of the gates in the modified gate-level netlist to a physical location on the chip floor. The operation is then led to step 206 to repeat the steps of 206, 208, 210, and 212 until the estimation becomes acceptable at step 208.

Figure 3:
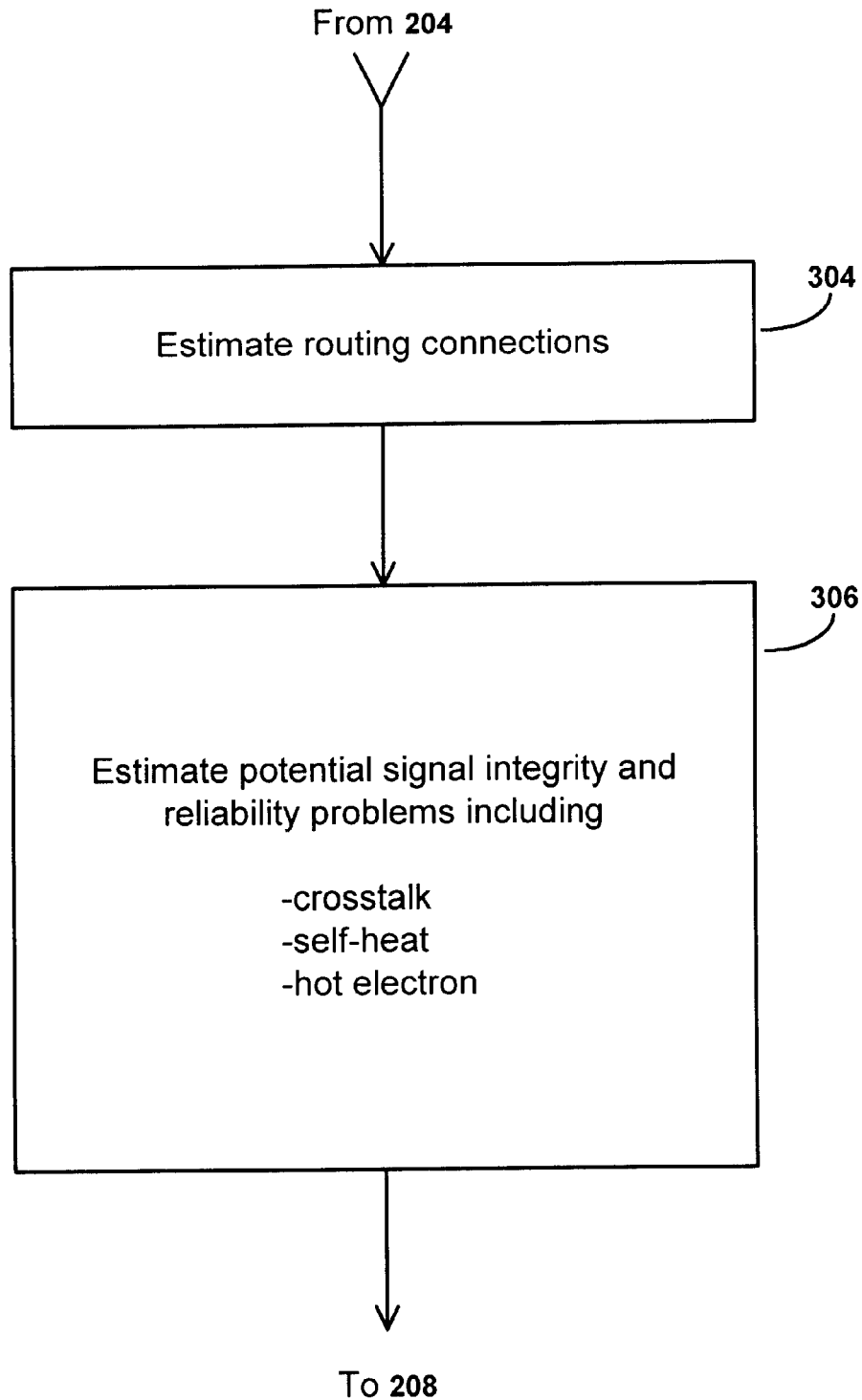
FIG. 3 is a flowchart illustrating the details in step 206 shown in FIG. 2, in accordance with the present invention.

FIG. 3 shows a flowchart illustrating the details in step 206 (estimating potential signal integrity and reliability problems) shown in FIG. 2, in accordance with the present invention.

As shown in FIG. 3, step 304 tentatively routes the connections for the gates in the placed netlist by using either Steiner tree routing or global routing. Steiner tree routing is a shortest interconnection pattern for the nets without considering the congestion caused by other routes. Global routing is an interconnection pattern that does consider the congestion caused by the other routes.

Step 306 estimates the potential signal integrity and reliability problems in the tentatively routed netlist. There are three types of potential problems, namely, (1) crosstalk, (2) self-heat, and (3) hot electron problems. At this time, the tentatively routed netlist is divided into a plurality of local nets, and step 306 estimates the potential signal integrity and reliability problems for each of the local nets.

The crosstalk problem is an electrical effect where the signal carried on one wire interferes with the signals carried on nearby wires. It can cause incorrect voltage levels or incorrect timing. The crosstalk problem estimation is based on the observation that a net is more sensitive to crosstalk problems if its delay is greater than the average transition time of nearby local nets. The delay time D for the given local net is estimated according to the equation: $D=k \times c+e$, where k is the k-factor of the driver (drive resistance) on a local net, c is the capacitance on a local net, and e is the maximum Elmore delay between an input pin and an output pin in a local net. Elmore delay is a formula that approximates the actual signal delay, between an input pin and an output pin.

The self-heat problem occurs when the current on a given local net exceeds the current limit of the local net. Three current parameters are used to estimate the self-heat problem for a given local net on the tentatively routed neatlist, namely, (1) average current I_avg, (2) peak current I_peak, and (3) root mean squared current I_rms. These three currents are calculated according the following three equations:

I_avg=2×(local net frequency)×(local net capacitance)× (voltage swing);

I_peak=[2×(local net capacitance)×(voltage swing)]/ (transition time); and

I_rms=(local net capacitance)×(voltage swing)×sqrt[2× (local net frequency)/(transition time)]

The hot electron problem represents the damage caused by transistors switching. For a pair of pins (an input pin i and an output pin o), the total damage TD (i, o) is estimated according to the following equation:

TD (i, o)=(maximum switching frequency)×(chip life time)×(damage per transition from the input pin i to the output pin o)

For an output pin o that is connected to a gate, the maximum switching frequency is approximated by the frequency of the clock corresponding to the gate. The total damage TD(o) for an output pin o is estimated according to the equation: TD(o)=maximum TD(i, o), for all input pin i with electronic connections to the output pin o.

Figure 4:
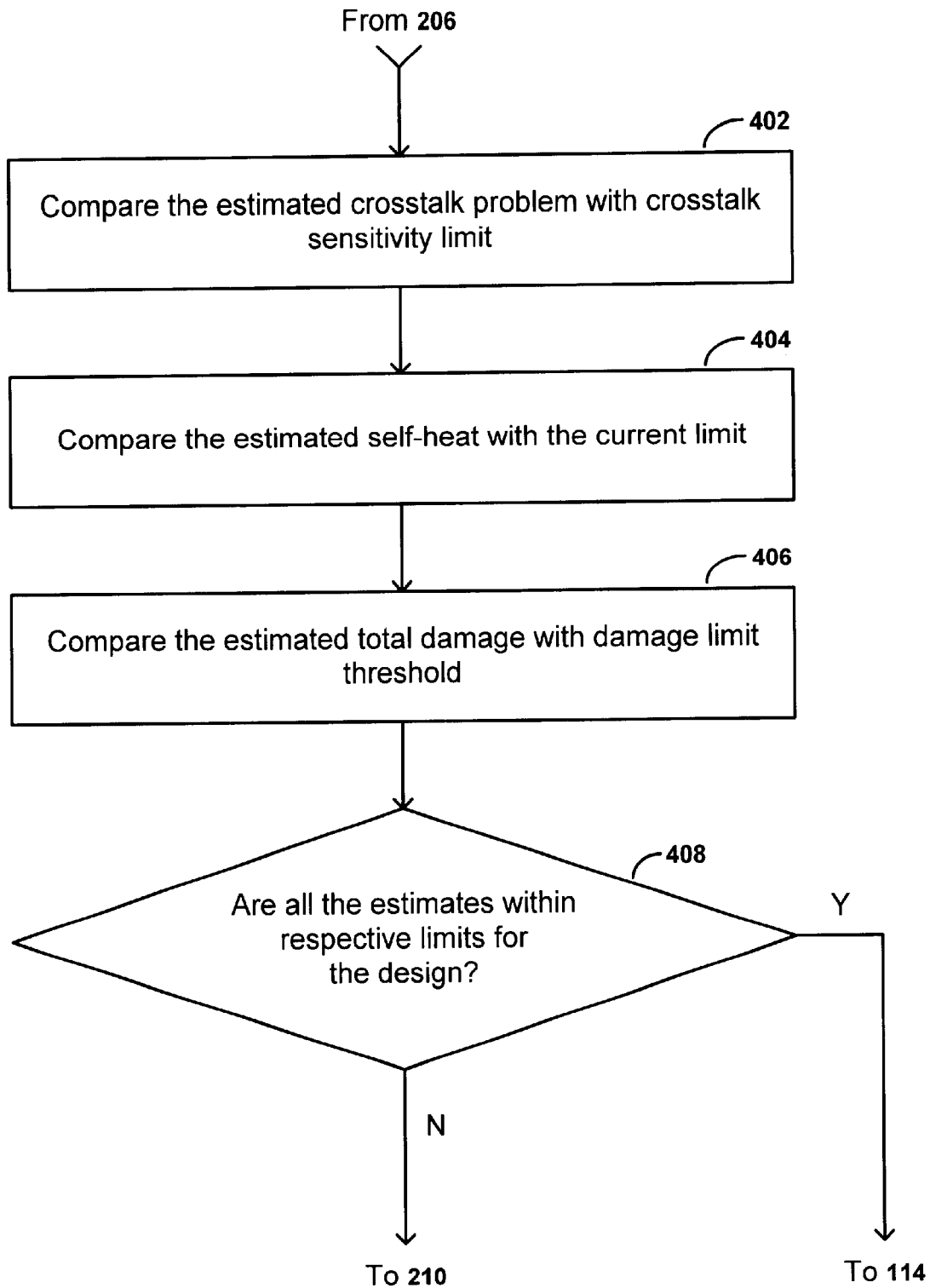
FIG. 4 a flowchart illustrating the details in step 208 as shown in FIG. 2, in accordance with the present invention.

FIG. 4 shows a flowchart illustrating the details in step 208 (determining whether the estimation is acceptable to the design) shown in FIG. 2, in accordance with the present invention.

As show in FIG. 4, step 402 compares the estimated crosstalk with the crosstalk sensitivity limit for the design. Specifically, step 402 compares the estimated D for a given local net with the average transition time of other nearby local nets. A given local net is not acceptable, if its estimated delay time D exceeds the average transition time t for the surrounding local nets.

Step 404 compares the estimated self-heat problem with the current limits on a given local net. Specifically, for a given local net, step 404 uses data provided by the process to calculate current limits, J_avg, J_peak, and J_rms for I_avg, I_peak, and I_rms respectively.

The routing patterns on the tentatively routed netlist comprises of wires and vias. The tentatively routed netlist may be routed onto several routing layers. Current density limits on the routing layers are indexed by frequency or by frequency and wire width. The current density on vias, which is used to connect between the routing layers, are indexed by frequency or by frequency and the side length of the square cut that will carry current in each of the vias. After the current has been calculated, step 404 compares the three current values (I_avg, I_peak, and I_rms) for a given local net with three corresponding current limits (J_avg, J_peak, and J_rms). A given local net is not acceptable if at least one of its three current values exceeds its corresponding current limit.

Step 406 compares the estimated total damage DT(o) for a given output pin o with the damage limit threshold for that pin. A gate is not acceptable, if it has an output pin o whose total damage DT(o) exceeds its damage limit threshold.

Figure 5:
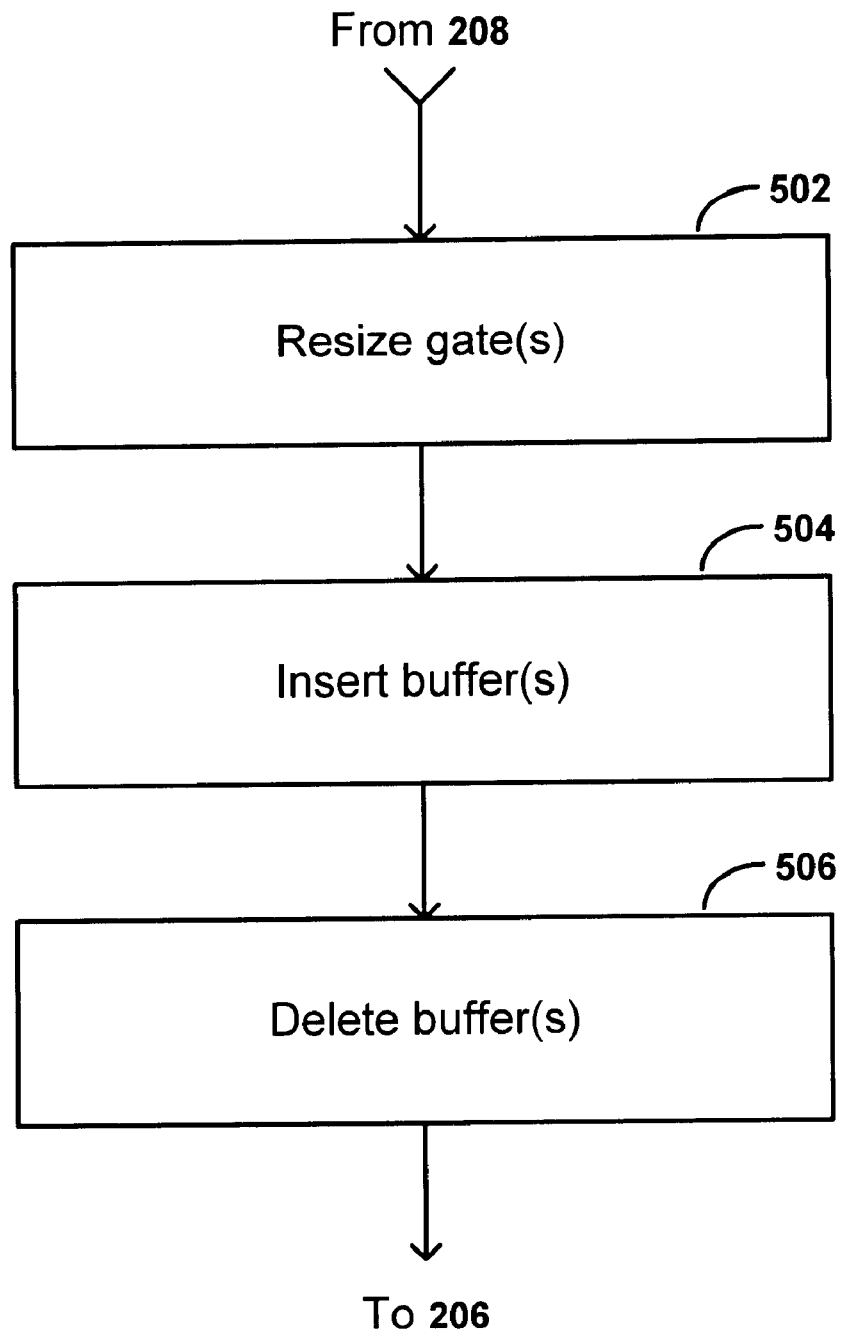
FIG. 5 show a flowchart the details in step 210 as shown in FIG. 2, in accordance with the present invention.

FIG. 5 shows a flowchart illustrating the details in step 210 (modifying the netlist) shown in FIG. 2, in accordance with the present invention.

As shown in FIG. 5, step 502 resizes the gates (or cells) in a given local net that is not acceptable. Specifically, each gate in a design is associated with a logic function. There are several different ways to implement a logic function, and they have different electrical properties. Thus, a gate size can be changed by replacing one implementation of a logic function with another implementation of the same function. Resizing can be used to rectify crosstalk or hot electron problems, because resizing a gate changes its delay properties, the damage per transition, and the damage limit threshold.

To illustrate how resizing corrects crosstalk problems, assume that a gate connected to an input pin i and an output pin o is a buffer referred as BUF1, and a gate to be used to resize the BUF1 is a buffer referred as BUF2. Further assume that the BUF1 has the following properties: (1) k-factor=2.0, (2) damage per transition (i, o, meaning the transition from the input pin i to the output pin o)=2.0, (3) damage limit at the output pin o=1.0×(100e+6 transitions/sec)×(1 year). Further assume that the BUF2 has the following properties: (1) k-factor=1.0, (2) damage per transition (i, o)=0.5, and (3) damage limit at its output pin o=2.0×(200e+6 transitions/sec)×(1 year). With BUF1, the delay time D(1). is equal to 2.0×c+e. With BUF2, the delay time D(2) is equal to 1.0×c+e. Thus, if D(1) >t>D(2), (t being the average transition time of nearby local nets), the crosstalk problem can be corrected by replacing BUF1 with BUF2.

With BUF1, the total damage T(o) at the output pin o is 2.0×(100e×6)×(1 year), which is greater than limit=1.0× (100e+6)×(1 year). With BUF2, the total damage T(o) at the output pin o is 0.5×100e×6×(1 year), which is less than 1.0×(100e×6)×(1 year). Thus, the hot electron problem can be corrected by replacing BUF1 with BUF2.

Step 504 inserts a buffer into a given local net that is not acceptable. A buffer computes the logical identity, that is, the output of the buffer equals to the input of the buffer. A buffer can also be represented by a pair of inverters. An inverter computes a logical negation, so that a pair of inverters computes the logical identity. An insertion of a buffer breaks the original local net into two local nets, and an insertion of a pair of inverters breaks the original local net into three local nets, without changing the logical function computed at remaining gate inputs. Buffer or inverter insertion can be used to correct crosstalk and self-heat problems, because such an insertion reduces the capacitance and decreases current.

To illustrate how buffer insertion corrects crosstalk problems, assume that a local net n, which is connected to an input pin i and an output pin o, has the following properties: (1) k-factor of original driver=k, (2) capacitance=2.0 pf, and, (3) Elmore delay from the output pin o to the input pin i is e. Thus, the delay time D(n) for the local net n is k×2.0+e. Inserting a buffer BUF with a k_factor k_BUF into a location b between the input pin i and the output pin o splits the net n into two sections, namely, (1) a first net section n_1 from the output pin o to the inserted location b and (2) a second net section n_2 from the inserted location b to the input pin i. After insertion of the BUF, the Elmore delay from the output pin o and the inserted location b is represented as e(o→b), and the Elmore delay from the inserted location b to the input pin i is represented by e(b→i). Therefore, D(n_1)=k×1.0+e(o→b), and D(n_2)=k_BUF×1.0+e(b→i). If e(b→i)<e, e(o→b)<e, and k_BUF<k, both D(n_1) and D(n_2) are less than D(n), thus improving crosstalk of the local net n.

To illustrate how buffer insertion corrects self-heat problem, let us consider 1avg by setting: (1) f=maximum switch frequency, and (2) V=voltage swing. Before splitting the local net n into two sections, the average current I_avg (n) for the local net n was 2×f×2.0×V. After splitting the local net n, the average current I_avg(n_1) for the first section n_1 is 2×f×1.0×V, and the average current I_avg (n_2) for the second section n_2 is 2×f×1.0×V. Since both I_avg(n_1) and I_avg(n_2) are less than I_avg(n), the self-heat problem of the local net n is improved. The peak current I_peak and root mean squared current I_rms can be reduced to correct self-heat problem by using the principle described in connection with the average current I_avg.

Step 506 deletes (or removes) a buffer to combine two local nets into a single local net, without changing the logical function computed at the remaining gate inputs. Buffer .deletion can be used to reduce the number of gates in the netlist, noting that it frees up resources for the gate resizing and buffer insertion, provided such a deletion does not cause any signal integrity and reliability problems.

Figure 6:
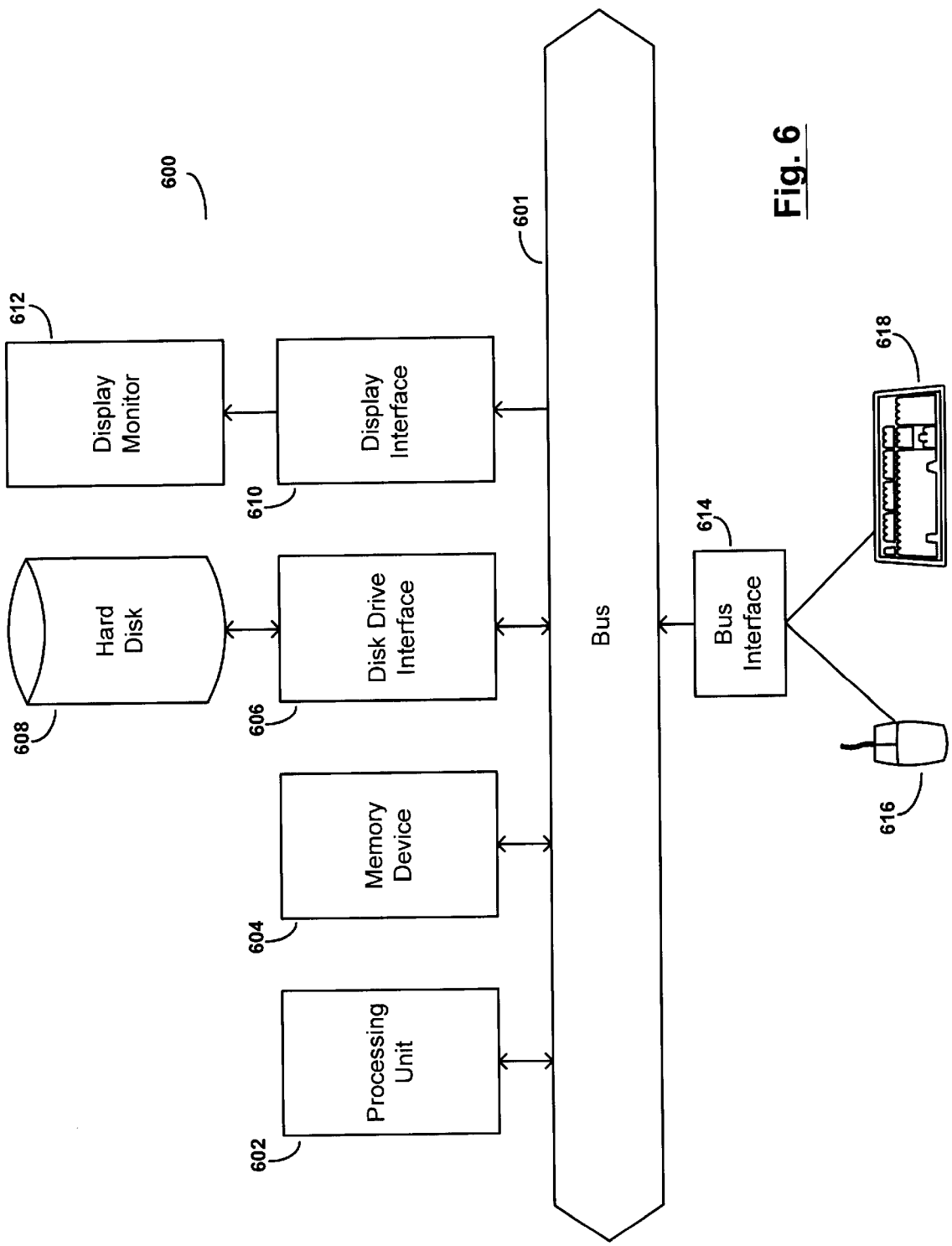
FIG. 6 shows a block diagram illustrating an exemplary computer system, which can be used as a hardware platform for running the program that performs the processes as shown in FIGS. 2–5, in accordance the present invention.

FIG. 6 shows a block diagram illustrating an exemplary computer system 600, which can be used as a hardware platform for running the program that performs the processes as shown in FIGS. 2–5, in accordance with the present invention.

As shown in FIG. 6, the computer system 600 includes a system bus 601, a processing unit 602, a memory device 604, a disk drive interface 606, a hard disk 608, a display interface 610, a display monitor 612, a bus interface 614, a mouse 616, and a keyboard 618.

The hard disk 608 is coupled to the disk drive interface 606; the monitor display 612 is coupled to the display interface 610; and the mouse 616 and keyboard 618 are coupled to the bus interface 614. Coupled to the system bus 601 are the processing unit 602, the memory device 604, the disk drive interface 606, and the display interface 610.

Memory device 604 stores data and programs. Operating together with the disk drive interface 606, the hard disk 608 also stores data and programs. However, memory device 604 has faster access speed than hard disk 608, while the hard disk 608 has higher capacity than memory device 604.

Operating together with the display interface 610, the display monitor 612 provides visual interfaces between the programs being executed and users, and displays the outputs generated by the programs.

Operating together with the serial bus interface 614, the mouse 616 and keyboard 618 provide input to the computer system 600.

The processing unit 602, which may include more than one processor, controls the operations of the computer system 600 by executing the programs stored in the memory device 604 and hard disk 608. The processing unit also controls the transmissions of data and programs, between the memory device 604 and the hard disk 608.

The program for performing the, processes shown in FIGS. 2–5 can be stored in the memory device 604 or hard disk 608, and executed by the processing unit 602. All the chip parameters (including average transition time t, current limits, damage limit threshold, etc.) can be stored in the memory device 604 or hard disk 608.

While the invention has been illustrated and described in detail in the drawing and foregoing description, it should be understood that the invention may be implemented through alternative embodiments within the spirit of the present invention. Thus, the scope of the invention is not intended to be limited to the illustration and description in this specification, but is to be defined by the appended claims.

What is claimed is:

1. A method for forming a physical layout on a chip floor based on a netlist for a circuit design, the netlist including a plurality of gates, the method comprising
    (a) assigning each of the gates to a physical location on the chip floor;
    (b) estimating potential signal integrity and reliability problems based on the assigned physical gate locations on the chip floor; and
    (c) if the estimation made in step (b) is not acceptable, then,
        (c-1) modifying the netlist based on the estimation of the signal integrity and reliability problems, and
        (c-2) re-assigning at least one gate in the modified netlist to another physical location on the chip floor.

2. The method of claim 1, further comprising the step of:
    (d) repeating the steps (c), (c-2), and (b) until the estimation made in step (b) is acceptable.

3. The method of claim 2, further comprising the step of:
    (e) routing all the gates to which physical locations are assigned in step (a) or in step (c-2), if the estimation made in step (b) is acceptable.

4. The method of claim 1, wherein the step (b) estimates the potential signal integrity and reliability problems, including crosstalk, self-heat, and hot electron problems.

5. The method of claim 1, wherein step (c-2) comprises modifying the netlist by resizing at least one gate on the netlist.

6. The method of claim 1, wherein the step (c-2) comprises modifying the netlist by inserting at least one buffer into the netlist.

7. The method of claim 1, wherein the step (c-2) comprises modifying the netlist by deleting at least one buffet from the netlist.

8. The method according to claim 1, wherein said step of estimating potential signal integrity and reliability problems comprises the steps of:
    performing a tentative routing of the netlist;
    dividing the tentatively routed netlist into plural nets; and
    determining potential signal integrity and reliability problems for each net.

9. The method according to claim 8, wherein said step of determining comprises determining potential crosstalk of each net.

10. The method according to claim 8, wherein said step of determining comprises determining potential self-heat problems of each net.

11. The method according to claim 8, wherein said step of determining potential signal integrity and reliability problems for each net comprises determining if current on a given local net exceeds a current limit of the local net.

12. The method according to claim 8, wherein the steps are embodied as instructions stored on a computer readable media, that, when loaded into a computer, cause the computer to perform the steps of the method.

13. An apparatus for forming a physical layout on a chip floor based on a netlist for a circuit design, the netlist including a plurality of gates, the apparatus comprising:
    (a) means for assigning each of the gates to a physical location on the chip floor;
    (b) means for estimating potential signal integrity and reliability problems based on the assigned physical gate locations on the chip floor;
    (c) means for modifying The netlist based on the estimation of the signal integrity and reliability problems, if the estimation is not acceptable; and
    (d) means for re-assigning gates in the modified netlist in another physical location on the, chip floor, if the estimation is not acceptable.

14. The apparatus of claim 13, further comprising:
    (e) means for determining whether the estimation performed by the estimating mean is acceptable.

15. The apparatus of claim 14, further comprising:
    (f) means for routing all the gates, if the estimation is acceptable.

16. The apparatus of claim 13, wherein the estimating means estimates the potential signal integrity and reliability problems, including, crosstalk, self-heat, and hot electron problems.

17. The apparatus of claim 8, wherein the modifying means modifies the netlist by resizing at least one gate on the netlist.

18. The apparatus of claim 13, wherein the modifying means modifies the netlist by inserting at least one buffer into the netlist.

19. The apparatus of claim 13, wherein the modifying means modifies the netlist by deleting at least one buffer from the netlist.

20. A method for forming a physical layout on a chip floor based on a netlist for a circuit design, the netlist including a plurality of gates, the method comprising the steps of:
    (a) assigning each of the gates to a location on the chip floor;
    (b) estimating potential signal integrity and reliability problems based on the assigned gate locations on the chip floor; and
    (c) if the estimation made in step (b) is not acceptable, then,
        (c-1) modifying the netlist based on the estimation of the signal integrity and reliability problems, and
        (c-2) re-assigning at least one gate in the modified netlist To a location on the chip floor;
    wherein:
        said step of estimating potential signal integrity and reliability problems comprises the steps of,
        performing a tentative routing of the netlist,
        dividing the tentatively routed netlist into plural nets, and
        determining potential signal integrity and reliability problems for each net; and
        said step of determining potential signal integrity and reliability problems for each net comprises determining if a delay of a net is greater than an average transition time of near-by nets.

21. The method according to claim 20, wherein delay of a net is estimated by calculating a delay (D) according to an equation:

$$D = k \times c + e;$$

wherein k is a k-factor of a drive resistance on the net, c is a capacitance on the net, and e is a maximum delay between an input pin and an output pin of the net.

22. The method according to claim 21, wherein the maximum delay is a maximum Elmore delay between an input pin and an output pin of the net.

23. A method for forming a physical layout on a chip floor based on a netlist for a circuit design, the netlist including a plurality of gates, the method comprising the steps of:
  (a) assigning each of the gates to a location on the chip floor;
  (b) estimating potential signal integrity and reliability problems based on the assigned gate locations on the chip floor; and
  (c) if the estimation made in step (b) is not acceptable, then,
    (c-1) modifying the netlist based on the estimation of the signal integrity and reliability problems, and
    (c-2) re-assigning at least one gate in the modified netlist to a location on the chip floor;
  wherein:
    said step of estimating potential signal integrity and reliability problems comprises the steps of,
    performing a tentative routing of the netlist,
    dividing the tentatively routed netlist into plural nets, and
    determining potential signal integrity and reliability problems for each net;
    said step of determining potential signal integrity and reliability problems for each net comprises determining if current on a given local net exceeds a current limit of the local net; and
    current (I) on a given local net is determined based on three current parameters, including I Average, I Peak, and I RMS, wherein:

I Average = 2 × (local net frequency) × (local net capacitance) × (voltage swing);

I Peak = [2 × (local net capacitance) × (voltage swing)] / (transition time);

and

I RMS = (local net capacitance) × (voltage swing) × sqrt [2 × (local net frequency) / (Transition time)].

24. The method according to claim 23, wherein:
  said step of determining potential signal integrity and reliability problems for each net includes the step of estimating damage caused by transistor switching, wherein, for each input pin i and output pin o, a total damage TD (i,o) is estimated by calculating:

TD (i,o) = (maximum switching frequency) × (chip life time) × (damage per transition); and for each output pin o that is connected to a gate, the maximum switching frequency is approximated by a frequency of a clock corresponding to the gate.

25. The method according to claim 24, wherein said step of estimating damage includes estimating a total damage TD (o) for each Output pin according to an equation:

TD (o) = maximum TP (i, o) for all input pins i with electric connections to the output pin o.

26. The method according to claim 25, wherein said step of modifying the netlist comprises resizing at least one gate of the netlist.

27. The method according to claim 25, wherein said step of modifying the netlist comprises inserting at least one buffer into the netlist.

28. The method according to claim 25, wherein said step of modifying the netlist comprises replacing one implementation of a logic function with another implementation of the same function.

29. A method for forming a physical layout on a chip floor based on a netlist for a circuit design, the netlist including a plurality of gates, the method comprising the steps of:
  assigning each of the gates to a physical location on the chip floor;
  estimating potential signal integrity and reliability problems based on the assigned physical gate locations on the chip floor;
  testing if the estimation made is not acceptable, then,
  modifying the netlist based on the estimation of the signal integrity and reliability problems, and
  re-assigning at least one gate in The modified netlist to another physical location on the chip floor;
  repeating the steps of testing and estimating until the estimated potential signal integrity and reliability problems are acceptable; and
  routing all the gates to which physical locations are assigned in either the estimating or modifying steps if the estimation is acceptable;
  wherein:
    the estimating step estimates the potential signal integrity and reliability problems, including crosstalk, self-heat, and hot electron problems;
    said step of estimating potential signal integrity and reliability problems comprises the steps of,
    performing a tentative routing of the netlist,
    dividing the tentatively routed netlist into plural nets, and
    determining potential signal integrity and reliability problems for each net, including estimating potential crosstalk of each net by determining if a delay of a net is greater than an average transition time of near-by nets, and estimating potential self-heat problems of each net by determining if current on a given local net exceeds a current limit of the local net;
    delay of a net is estimated by calculating a delay (D) according to an equation:

$$D = k \times c + e,$$

where k is a k-factor of a drive resistance on the net, c is a capacitance on the net, and e is a maximum Elmore delay between an input pin and an output pin of the net; and
    current (I) on a given local net is determined based on three current parameters, including I Average, I Peak, and I RMS, wherein:

I Average = 2 × (local net frequency) × (local net capacitance) × (voltage swing), I Peak = [2 × (local net capacitance) × (voltage swing)] / (transition time), and $I_{RMS} = $(local net capacitance)×(voltage swing)×sqrt (2×(local net frequency)/(transition time));

said step of determining potential signal integrity and reliability problems for each net includes the step of estimating damage caused by transistor switching, wherein, for each input pin i and output pin o, a total damage TD (i,o) is estimated by calculating TD (i,o)=(maximum switching frequency)×(chip life time)× (damage per transition);

for each output pin o that is connected to a gate, the maximum switching frequency is approximated by a frequency of a clock corresponding to the gate;

said estimating damage includes estimating a total damage TD (o) for each output pin according to an equation TD (o)=maximum to (i, o) for all input pins i with electric connections to the output pin o; and wherein said step of modifying the netlist comprises resizing at least one gate by replacing one implementation of a logic function with another implementation of the same function, and at least one of inserting a buffer and deleting a buffer.

30. A computer readable media, having instructions stored thereon, that, when loaded into a computer, cause the computer to perform the steps of:
  (a) assigning each of a plurality of gates in a netlist to a physical location on a chip floor;
  (b) estimating potential signal integrity and reliability problems based on the assigned physical gate locations on the chip floor; and
  (c) if the estimation made in step (b) is not acceptable, then,
    (c-1) modifying the netlist based on the estimation of the signal integrity and reliability problems, and
    (c-2) re-assigning at least one gate in the modified netlist to another physical location on the chip floor.

\* \* \* \* \*